(12) United States Patent
Tezuka et al.

(10) Patent No.: US 9,979,272 B2
(45) Date of Patent: May 22, 2018

(54) SEMICONDUCTOR DEVICE

(71) Applicant: FUJI ELECTRIC CO., LTD., Kawasaki-shi, Kanagawa (JP)

(72) Inventors: Shinichi Tezuka, Matsumoto (JP); Hidetomo Ohashi, Matsumoto (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 0 days. days.

(21) Appl. No.: 15/608,582

(22) Filed: May 30, 2017

(65) Prior Publication Data
US 2017/0264184 A1 Sep. 14, 2017

Related U.S. Application Data

(63) Continuation of application No. PCT/JP2016/067584, filed on Jun. 13, 2016.

(30) Foreign Application Priority Data

Jun. 16, 2015 (JP) ................................ 2015-120880

(51) Int. Cl.
| | |
|---|---|
| *H02M 1/084* | (2006.01) |
| *H03K 17/0812* | (2006.01) |
| *H01L 29/78* | (2006.01) |
| *H03K 17/687* | (2006.01) |
| *H01L 29/08* | (2006.01) |

(Continued)

(52) U.S. Cl.
CPC ......... *H02M 1/084* (2013.01); *G11C 11/4091* (2013.01); *H01L 29/0603* (2013.01); *H01L 29/772* (2013.01); *H01L 29/7802* (2013.01); *H02M 7/48* (2013.01); *H03K 17/08122* (2013.01); *H03K 17/687* (2013.01); *G11C 2211/4013* (2013.01)

(58) Field of Classification Search
CPC ............... H01L 29/772; H01L 29/0603; H01L 29/7802
See application file for complete search history.

(56) References Cited

U.S. PATENT DOCUMENTS 9,344,078 B1 * 5/2016 Finney ............... H03K 17/0822
9,502,955 B2 * 11/2016 Ohashi .................... H02M 1/08
(Continued)

FOREIGN PATENT DOCUMENTS

| JP | 2004-120152 A | 4/2004 |
|---|---|---|
| JP | 2005-130355 A | 5/2005 |

(Continued)

*Primary Examiner* — Seahvosh Nikmanesh
(74) *Attorney, Agent, or Firm* — Rabin & Berdo, P.C.

(57) ABSTRACT

In a semiconductor device, a high-side potential determination circuit outputs an event signal when a high-side reference potential detected by a high-side potential detection circuit rises. If at that time an input logic signal for controlling a high side is at a low (L) level, a pulse generation circuit regenerates a reset signal for a high-side drive circuit. When the input logic signal for controlling the high side is at the L level and the event signal is inputted, an overcurrent detection determination circuit makes an overcurrent detection signal from an overcurrent detection circuit invalid. When the event signal is not inputted, the overcurrent detection determination circuit makes the overcurrent detection signal valid.

6 Claims, 8 Drawing Sheets

(51) Int. Cl.
*H01L 29/772* (2006.01)
*H02M 7/48* (2007.01)
*G11C 11/4091* (2006.01)
*H01L 29/06* (2006.01)

(56) References Cited

U.S. PATENT DOCUMENTS

2005/0088227 A1  4/2005  Sakata
2016/0036315 A1  2/2016  Ohashi et al.

FOREIGN PATENT DOCUMENTS

JP    2005-303969 A    10/2005
WO    WO-2015/045534 A1    4/2015

\* cited by examiner

SEMICONDUCTOR DEVICE

CROSS-REFERENCE TO RELATED APPLICATION

This application is a continuation application of International Application PCT/JP2016/067584 filed on Jun. 13, 2016 which designated the U.S., which claims priority to Japanese Patent Application No. 2015-120880, filed on Jun. 16, 2015, the entire contents of which are incorporated herein by reference.

BACKGROUND OF THE INVENTION

1. Field of the Invention

The embodiments discussed herein are related to a semiconductor device having the overcurrent protection function of detecting that an overcurrent flows through two power devices that are connected in series (hereinafter, also referred to as "totem-pole-connected").

2. Background of the Related Art

With inverters or converters the following circuit structure is adopted. Power devices are totem-pole-connected and high-side and low-side power devices are driven by drive circuits. That is to say, on a high side a signal generated by a pulse generation circuit with a ground potential as reference is level-shifted by a level shift circuit and is then transmitted to a high-side drive circuit to on-off drive the high-side power device. On the other hand, on a low side a signal generated with the ground potential as reference is transmitted to a low-side drive circuit to on-off drive the low-side power device.

A totem pole midpoint, which is a connection point of the low-side power device and the high-side power device, is connected to an inductive load such as a motor. As a result, external noise caused by an inductive load, parasitic inductance, or the like may be superimposed on the totem pole midpoint. At this time a potential at the totem pole midpoint goes into an overshooting state or an undershooting state, depending on the magnitude, timing, or the like of the noise. That is to say, a potential at the totem pole midpoint becomes higher than or equal to a high-voltage potential of the high-side power device or becomes lower than or equal to the ground potential.

When a potential at the totem pole midpoint becomes lower than the ground potential, an off signal may be outputted from the pulse generation circuit to the high-side power device. In that case, on the high side the level shift circuit does not normally transmit the signal to the high-side drive circuit. As a result, the high-side power device does not turn off at timing at which it needs to turn off. That is to say, the high-side power device remains on. Accordingly, the original switching function is not maintained.

A technique for meeting a case where a high-side power device does not turn off at timing at which it needs to turn off is known (see, for example, Japanese Laid-open Patent Publication No. 2004-120152). According to the technique disclosed in, for example, Japanese Laid-open Patent Publication No. 2004-120152, a second off signal is outputted a determined time after a first off signal is outputted. As a result, even if the level shift circuit does not normally transmit the first off signal to the high-side drive circuit, the level shift circuit normally transmits the second off signal to the high-side drive circuit. This avoids a functional malfunction.

With the technique disclosed in, for example, Japanese Laid-open Patent Publication No. 2004-120152, however, the first off signal and the second off signal are simply outputted mechanically at a certain interval. There is a possibility that even when the determined time has elapsed, new external noise will be generated. That is to say, in essence, a malfunction is not completely avoided.

Accordingly, the following technique is proposed. The determination that the level shift circuit does not normally transmit a reset signal for putting the high-side power device into an off state is made and a second reset signal is regenerated (see, for example, International Publication Pamphlet No. WO2015/045534). A semiconductor device disclosed in, for example, International Publication Pamphlet No. WO2015/045534 includes a high-side potential detection circuit which detects a high-side potential and a high-side potential determination circuit which outputs an event signal on the basis of a change in the high-side potential detected by the high-side potential detection circuit. With this semiconductor device a pulse generation circuit regenerates a reset signal according to an event signal outputted from the high-side potential determination circuit and an input logic signal inputted from the outside. That is to say, the high-side potential determination circuit monitors the high-side potential (reference potential or a power source potential) detected by the high-side potential detection circuit. When the high-side potential determination circuit determines that there is a change in high-side potential which impedes the transmission of a reset signal by the level shift circuit, the high-side potential determination circuit outputs an event signal. If timing at which the pulse generation circuit receives the event signal from the high-side potential determination circuit falls on timing at which the reset signal is generated, the pulse generation circuit regenerates a reset signal. When the transmission of a reset signal is impeded in this way by external noise, a reset signal is regenerated. As a result, the high-side power device is reliably turned off.

With the semiconductor device disclosed in, for example, International Publication Pamphlet No. WO2015/045534, when an event signal which is indicative that the transmission of a reset signal may be impeded is outputted at reset timing at which the high-side power device is turned off, a reset signal is regenerated. By doing so, the high-side power device is reliably turned off. However, for example, if dead time (which is set for preventing a short circuit between an upper arm and a lower arm and which is delay time from the time when one power device is turned off to the time when the other power device is turned on) for power devices totem-pole-connected is short, if the influence of external noise is not negligible, or if a high-side potential changes for a long period, an off signal may be outputted behind regular timing. In such a case, the low-side power device is turned on before the high-side power device is turned off. As a result, a short circuit occurs between the upper arm and the lower arm and an overcurrent flows through the power devices. An overcurrent is detected on the low side. This causes an unintentional cessation of operation.

SUMMARY OF THE INVENTION

According to an aspect, there is provided a semiconductor device including a high-side drive circuit which drives a high-side power device totem-pole-connected with a low-side power device on the basis of a high-side logic signal, a high-side potential detection circuit which detects a high-side potential, a high-side potential determination circuit which outputs an event signal on the basis of a change in the high-side potential detected by the high-side potential detection circuit, a low-side drive circuit which drives the low-side power device totem-pole-connected with the high-side power device on the basis of a low-side logic signal, an overcurrent detection circuit which outputs, at the time of detecting an overcurrent by inputting a current signal indicative of a current value of a principal current of the low-side power device, an overcurrent detection signal for turning off the low-side power device, and an overcurrent detection determination circuit which determines on the basis of the high-side logic signal and the event signal whether to transmit the overcurrent detection signal to the low-side drive circuit, wherein the overcurrent detection determination circuit makes invalid the overcurrent detection signal detected by turning on the low-side power device before outputting the event signal. The high-side power device is connected in series with the low-side power device.

The object and advantages of the invention will be realized and attained by means of the elements and combinations particularly pointed out in the claims.

It is to be understood that both the foregoing general description and the following detailed description are exemplary and explanatory and are not restrictive of the invention.

DETAILED DESCRIPTION OF THE INVENTION

Embodiments will now be described in detail with reference to the accompanying drawings.

First Embodiment

Figure 1:
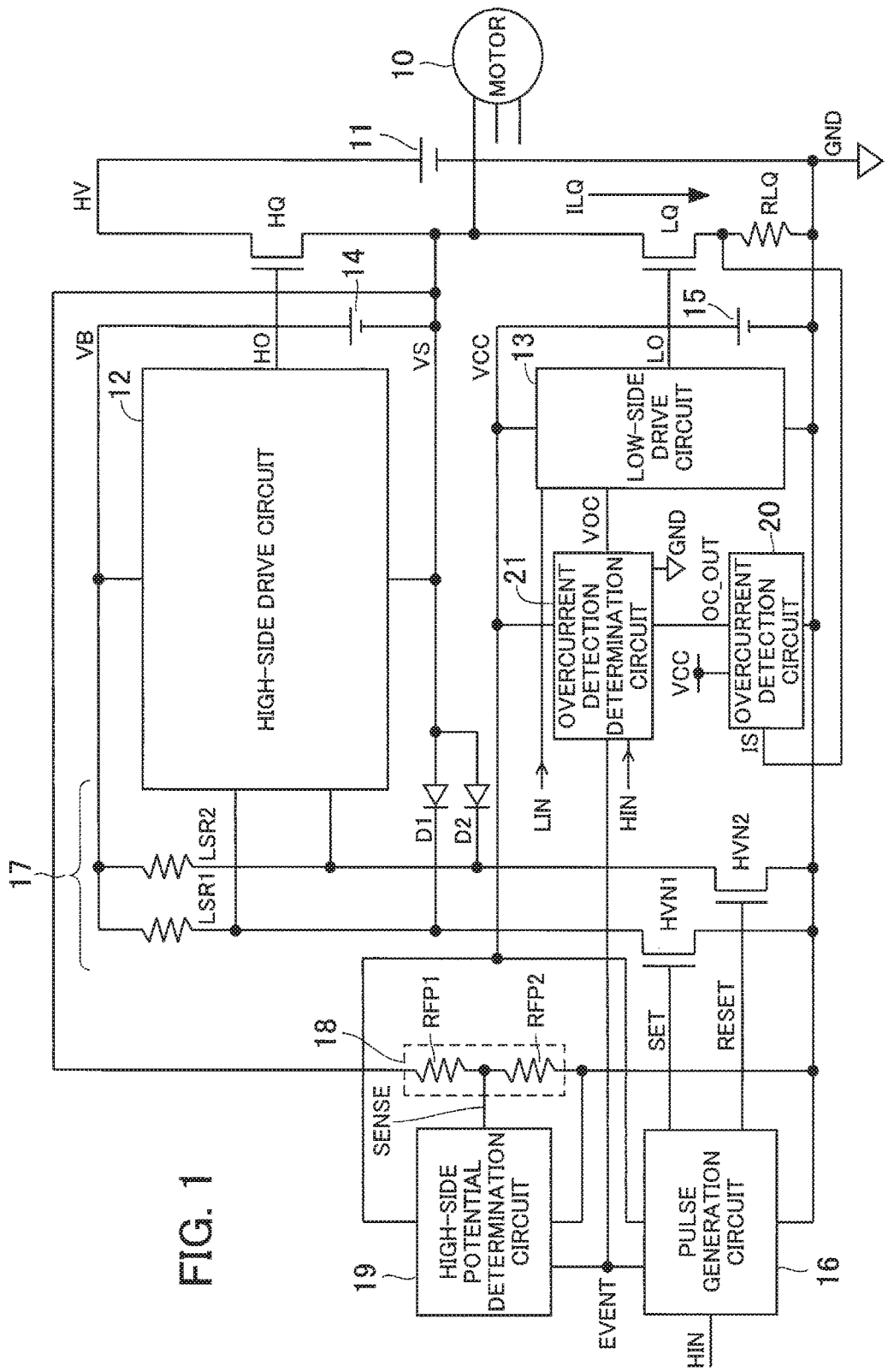
FIG. 1 is a circuit diagram illustrative of a semiconductor device according to a first embodiment.
Figure 2:
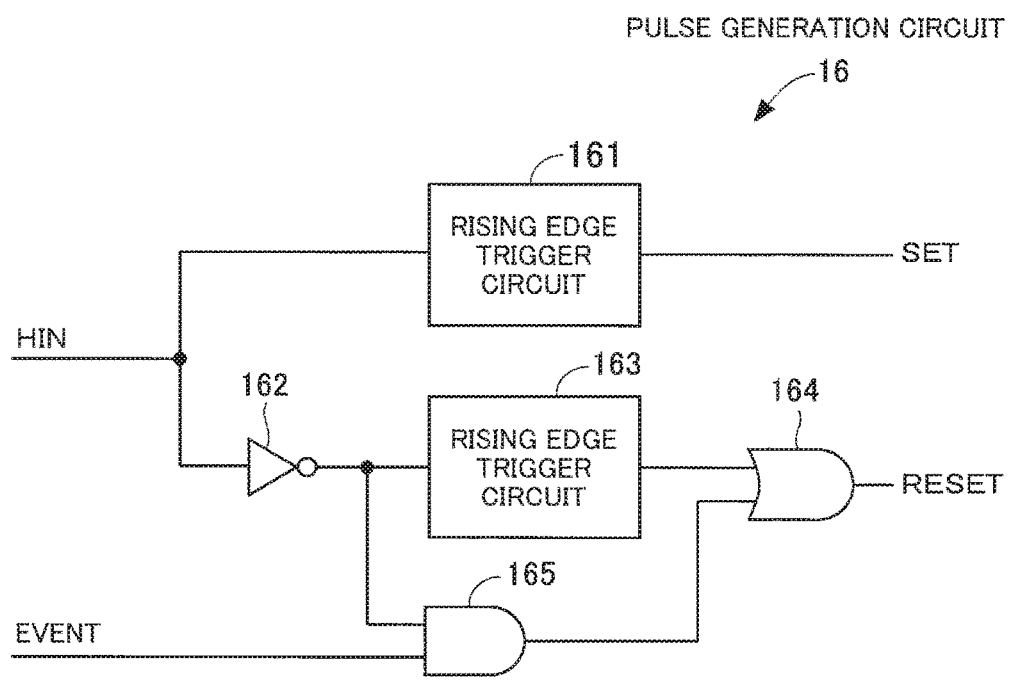
FIG. 2 is a circuit diagram illustrative of an example of a pulse generation circuit.
Figure 3:
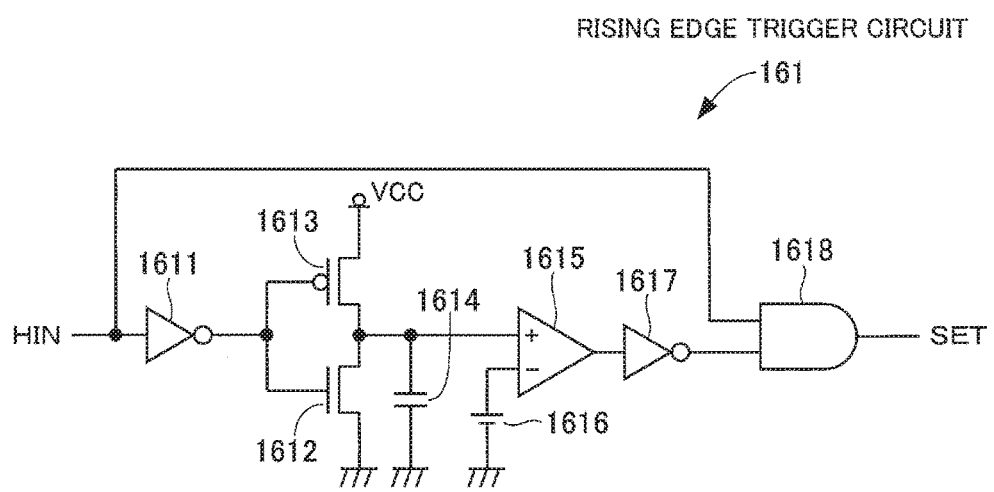
FIG. 3 is a circuit diagram illustrative of an example of a rising edge trigger circuit.
Figure 4:
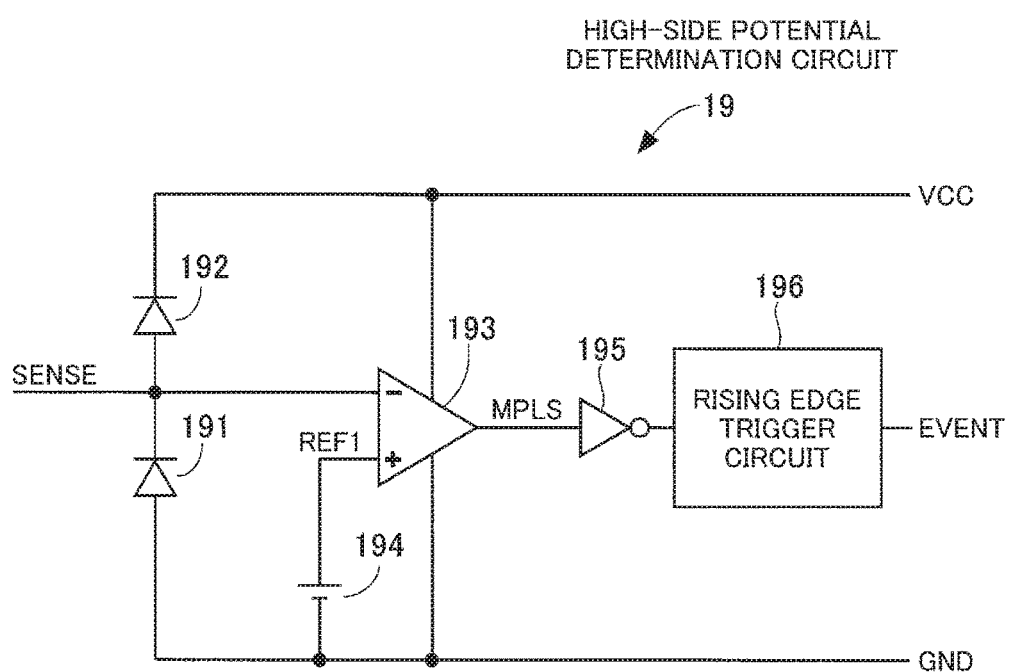
FIG. 4 is a circuit diagram illustrative of an example of a high-side potential determination circuit.
Figure 5:
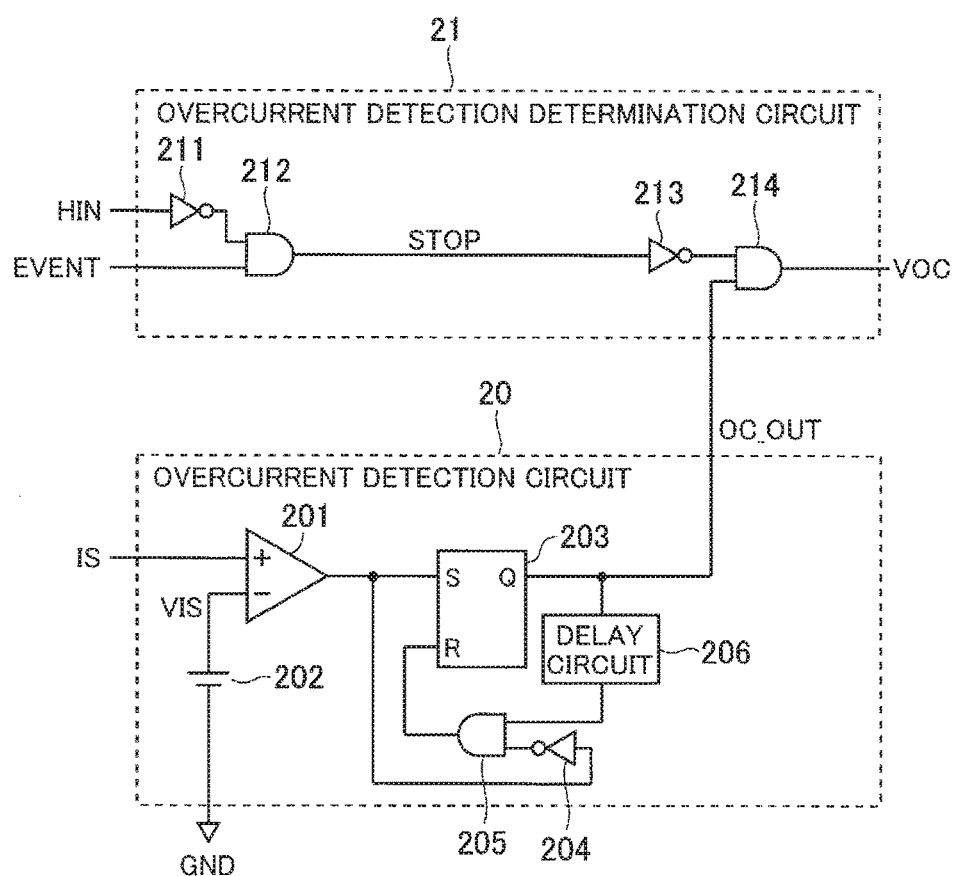
FIG. 5 is a circuit diagram illustrative of examples of an overcurrent detection circuit and an overcurrent detection determination circuit of the semiconductor device according to the first embodiment.
Figure 6:
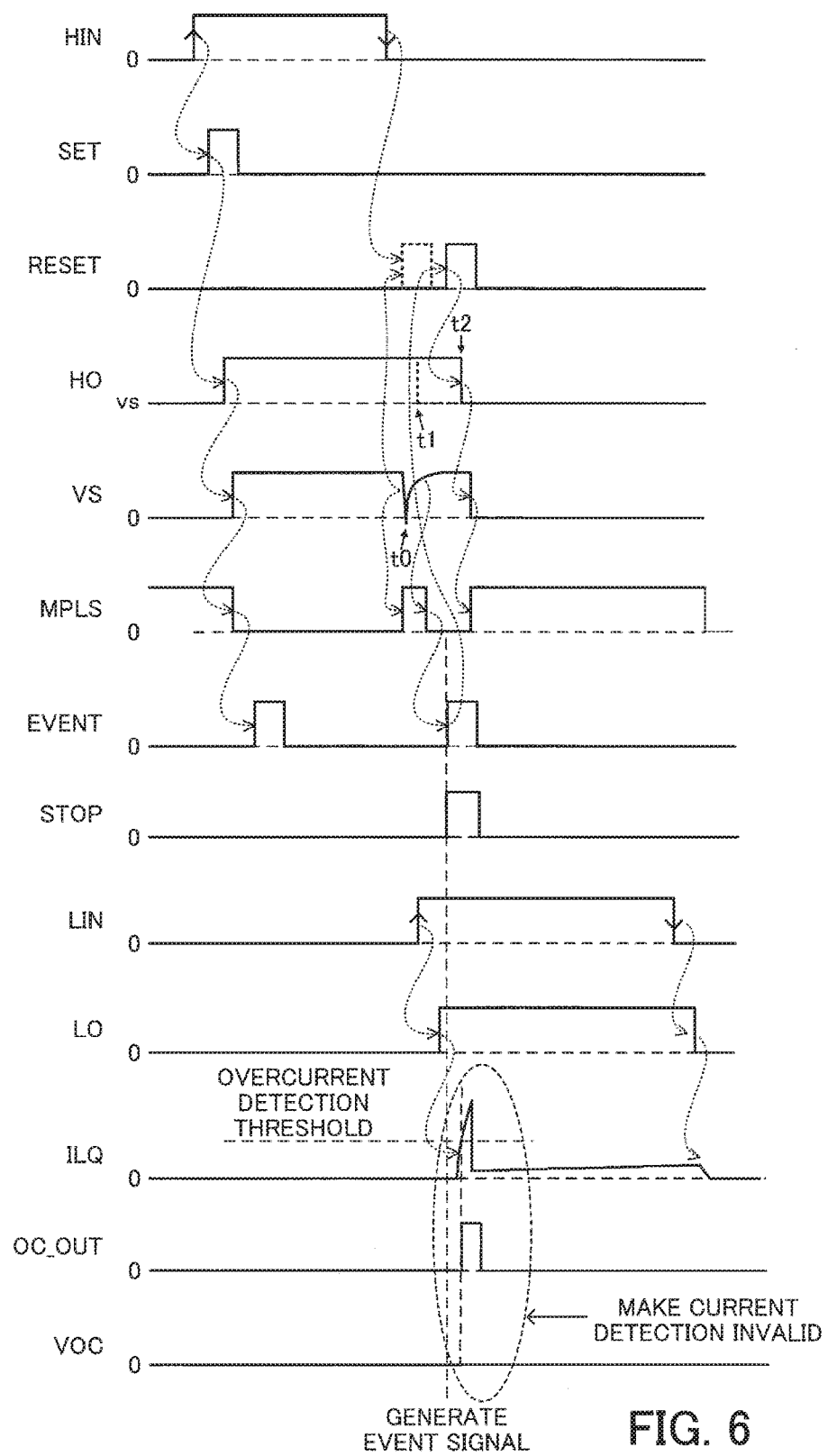
FIG. 6 is a timing chart illustrative of waveforms of important parts at the time of the switching operation of the semiconductor device.

FIG. 1 is a circuit diagram illustrative of a semiconductor device according to a first embodiment. FIG. 2 is a circuit diagram illustrative of an example of a pulse generation circuit. FIG. 3 is a circuit diagram illustrative of an example of a rising edge trigger circuit. FIG. 4 is a circuit diagram illustrative of an example of a high-side potential determination circuit. FIG. 5 is a circuit diagram illustrative of examples of an overcurrent detection circuit and an overcurrent detection determination circuit of the semiconductor device according to the first embodiment. FIG. 6 is a timing chart illustrative of waveforms of important parts at the time of the switching operation of the semiconductor device. In the following description the same numeral may be used for representing the name of a terminal and a voltage, a signal, or the like at the terminal.

A semiconductor device according to a first embodiment is used for controlling and driving a motor 10. It is assumed that the motor 10 is, for example, a three-phase induction motor. FIG. 1 illustrates only a part of a semiconductor device which outputs AC power corresponding to one phase.

This semiconductor device includes a high-side power device HQ and a low-side power device LQ totem-pole-connected. In the first embodiment the high-side power device HQ and the low-side power device LQ are n-channel power metal oxide semiconductor field effect transistors (MOSFETs). The high-side power device HQ and the low-side power device LQ may be other power devices such as insulated gate bipolar transistors (IGBTs).

A drain of the high-side power device HQ is connected to a positive electrode terminal of a high-voltage power source 11 and a negative electrode terminal of the high-voltage power source 11 is connected to a ground GND. A source of the low-side power device LQ is connected to the ground GND via a resistor RLQ. A connection point of a source of the high-side power device HQ and a drain of the low-side power device LQ, that is to say, a totem pole midpoint is connected to the motor 10.

A gate of the high-side power device HQ is connected to an output terminal HO of a high-side drive circuit 12. A gate of the low-side power device LQ is connected to an output terminal LO of a low-side drive circuit 13. A reference potential terminal of the high-side drive circuit 12 is connected to the totem pole midpoint and a negative electrode terminal of a high-side power source 14 and a power source terminal of the high-side drive circuit 12 is connected to a positive electrode terminal of the high-side power source 14. A reference potential terminal of the low-side drive circuit 13 is connected to the ground GND and a negative electrode terminal of a low-side power source 15 and a power source terminal of the low-side drive circuit 13 is connected to a positive electrode terminal of the low-side power source 15. A low-side power source potential is indicated by VCC with the ground GND as reference. A high-side reference potential and a high-side power source potential are indicated by VS and VB, respectively, with the ground GND as reference.

Furthermore, the semiconductor device includes a pulse generation circuit 16, a level shift circuit 17, a high-side potential detection circuit 18, a high-side potential determination circuit 19, an overcurrent detection circuit 20, and an overcurrent detection determination circuit 21.

The pulse generation circuit 16 inputs from the outside an input logic signal (high-side logic signal) HIN for controlling a high side and generates a set signal SET and a reset signal RESET. To be concrete, as illustrated in FIG. 2, the pulse generation circuit 16 includes a rising edge trigger circuit 161 which inputs the input logic signal HIN and which outputs the set signal SET. Furthermore, the pulse generation circuit 16 includes an inverter 162, a rising edge trigger circuit 163, an OR circuit 164, and an AND circuit 165. An input of the inverter 162 is connected to an input terminal of the input logic signal HIN and an output of the inverter 162 is connected to an input of the rising edge trigger circuit 163 and one input of the AND circuit 165. An output of the rising edge trigger circuit 163 is connected to one input of the OR circuit 164. An output of the OR circuit 164 is an output terminal RESET of the reset signal RESET. The other input of the AND circuit 165 is connected to an input terminal of an event signal EVENT outputted from the high-side potential determination circuit 19. An output of the AND circuit 165 is connected to the other input of the OR circuit 164.

As illustrated in FIG. 3, the rising edge trigger circuit 161 includes an inverter 1611 whose input is connected to the input terminal of the input logic signal HIN. An output of the inverter 1611 is connected to gates of an nMOS transistor 1612 and a pMOS transistor 1613. A source of the nMOS transistor 1612 is connected to the ground GND and a drain of the nMOS transistor 1612 is connected to a drain of the pMOS transistor 1613. A source of the pMOS transistor 1613 is connected to the positive electrode terminal of the low-side power source 15 which supplies the low-side power source potential VCC. An output of an inverter circuit made up of the nMOS transistor 1612 and the pMOS transistor 1613 is connected to one end of a capacitor 1614. The other end of the capacitor 1614 is connected to the ground GND. Furthermore, the output of the inverter circuit is connected to a non-inverting input of a comparator 1615. A positive electrode terminal of a reference voltage source 1616 is connected to an inverting input of the comparator 1615. A negative electrode terminal of the reference voltage source 1616 is connected to the ground GND. An output of the comparator 1615 is connected to an input of an inverter 1617. An output of the inverter 1617 is connected to one input of an AND circuit 1618. The other input of the AND circuit 1618 is connected to the input terminal of the input logic signal HIN. An output of the AND circuit 1618 is an output terminal SET which outputs the set signal SET.

A concrete example of the rising edge trigger circuit 161 has been described. The rising edge trigger circuit 163 has the same structure. Therefore, the operation of the following rising edge trigger circuit 163 will be described by reference to FIG. 3. An input of the rising edge trigger circuit 163 is a signal obtained by logic-inverting the input logic signal HIN. An output of the rising edge trigger circuit 163 becomes the reset signal RESET via the OR circuit 164.

The level shift circuit 17 includes high breakdown voltage nMOS transistors HVN1 and HVN2, resistors LSR1 and LSR2, and clamp diodes D1 and D2. Gates of the nMOS transistors HVN1 and HVN2 are connected to the set signal output terminal SET and the reset signal output terminal RESET, respectively, of the pulse generation circuit 16. A drain of the nMOS transistor HVN1 is connected to one end of the resistor LSR1 and a drain of the nMOS transistor HVN2 is connected to one end of the resistor LSR2. The other end of the resistor LSR1 and the other end of the resistor LSR2 are connected to the high-side power source potential VB of the high-side drive circuit 12. A connection point of the drain of the nMOS transistor HVN1 and the resistor LSR1 is connected to an input terminal of the high-side drive circuit 12 and a cathode terminal of the diode D1. A connection point of the drain of the nMOS transistor HVN2 and the resistor LSR2 is connected to an input terminal of the high-side drive circuit 12 and a cathode terminal of the diode D2. Anode terminals of the diodes D1 and D2 are connected to the high-side reference potential VS of the high-side drive circuit 12, that is to say, to the totem pole midpoint. Sources of the nMOS transistors HVN1 and HVN2 are connected to the ground GND.

The high-side potential detection circuit 18 detects a high-side potential. In the example of FIG. 1, the high-side potential detection circuit 18 detects the high-side reference potential VS. In the first embodiment a resistant field plate (RFP) is used as a detection means. The resistant field plates are formed for the purpose of relaxing an electric field at a voltage withstand region high voltage junction terminal (HVJT) in a high withstand voltage region device of a high-side circuit (see, for example, International Publication No. WO2013/069408). One terminal of the resistant field plate is connected to the totem pole midpoint and the other terminal of the resistant field plate is connected to the ground GND. With the high-side potential detection circuit 18 a branch point is provided in the resistant field plate to divide it into two resistors RFP1 and RFP2. The branch point of the resistant field plate is connected to an input terminal of the high-side potential determination circuit 19 and outputs a detection signal SENSE indicative of a change in the high-side reference potential VS.

The high-side potential determination circuit 19 inputs the detection signal SENSE outputted from the high-side potential detection circuit 18 and generates an event signal EVENT according to a change in the high-side reference potential VS. As illustrated in FIG. 4, the high-side potential determination circuit 19 includes two protection diodes 191 and 192, a comparator 193, a reference voltage source 194, an inverter 195, and a rising edge trigger circuit 196. Furthermore, the high-side potential determination circuit 19, together with the high-side potential detection circuit 18, is placed on a low-side potential side on which the potential of the ground GND is reference.

In the high-side potential determination circuit 19 an input terminal of the detection signal SENSE is connected to a cathode of the protection diode 191, an anode of the protection diode 192, and an inverting input of the comparator 193. An anode of the protection diode 191 is connected to the ground GND. A cathode of the protection diode 192 is connected to the low-side power source potential VCC. A non-inverting input of the comparator 193 is connected to a positive electrode terminal of the reference voltage source 194. A negative electrode terminal of the reference voltage source 194 is connected to the ground GND. An output of the comparator 193 is connected to an input of the rising edge trigger circuit 196 via the inverter 195. An output of the rising edge trigger circuit 196 is an output terminal which outputs the event signal EVENT. The circuit structure of the rising edge trigger circuit 196 is the same as that of the rising edge trigger circuit 161 illustrated in FIG. 3. Therefore, the operation of the following rising edge trigger circuit 196 will be described by reference to FIG. 3. An input of the rising edge trigger circuit 196 is a signal obtained by inverting an output signal MPLS of the comparator 193. An output of the rising edge trigger circuit 196 is the event signal EVENT.

The overcurrent detection circuit 20 inputs a current signal IS indicative of a current value of a principal current flowing through the low-side power device LQ. When the current signal IS exceeds a determined current value, the overcurrent detection circuit 20 outputs an overcurrent detection signal OC_OUT. The current signal IS is a signal (=(current value)×(resistance value of resistor RLQ)) obtained by converting the current value of the principal current to a voltage by the resistor RLQ connected between the source of the low-side power device LQ and the ground GND, and is inputted to the overcurrent detection circuit 20. As illustrated in FIG. 5, the overcurrent detection circuit 20 includes a comparator 201, a reference voltage source 202, an RS flip-flop (second RS flip-flop) 203, an inverter 204, an AND circuit 205, and a delay circuit 206.

In the overcurrent detection circuit 20 a non-inverting input of the comparator 201 is connected to a connection point of the source of the low-side power device LQ and the resistor RLQ. The current signal IS is inputted to the non-inverting input of the comparator 201. A positive electrode terminal of the reference voltage source 202 is connected to an inverting input of the comparator 201. A negative electrode terminal of the reference voltage source 202 is connected to the ground GND. An output of the comparator 201 is connected to a set input terminal of the RS flip-flop 203 and an input of the inverter 204. An output of the inverter 204 is connected to one input of the AND circuit 205. An output of the AND circuit 205 is connected to a reset input terminal of the RS flip-flop 203. An output terminal of the RS flip-flop 203 is connected to an input of the delay circuit 206 and an output of the delay circuit 206 is connected to the other input of the AND circuit 205. Furthermore, the output terminal of the RS flip-flop 203 is an output terminal of the overcurrent detection circuit 20 which outputs the overcurrent detection signal OC_OUT, and is connected to the overcurrent detection determination circuit 21.

The overcurrent detection determination circuit 21 has input terminals for the overcurrent detection signal OC_OUT, the event signal EVENT, and the input logic signal HIN for controlling the high side and has an output terminal for an overcurrent signal VOC.

As illustrated in FIG. 5, the overcurrent detection determination circuit 21 includes an inverter 211, an AND circuit 212, an inverter 213, and an AND circuit 214. The input logic signal HIN for controlling the high side is inputted to an input of the inverter 211. An output of the inverter 211 is connected to one input of the AND circuit 212. The event signal EVENT is inputted to the other input of the AND circuit 212. A signal STOP is outputted from an output of the AND circuit 212. The output of the AND circuit 212 is connected to an input of the inverter 213. An output of the inverter 213 is connected to one input of the AND circuit 214. The overcurrent detection signal OC_OUT is inputted from the overcurrent detection circuit 20 to the other input of the AND circuit 214. An output of the AND circuit 214 is the output terminal of the overcurrent detection determination circuit 21 and the overcurrent signal VOC is outputted.

An output of the overcurrent detection determination circuit 21 is connected to the low-side drive circuit 13. On the basis of an input logic signal (low-side logic signal) LIN from the outside and the overcurrent signal VOC from the overcurrent detection determination circuit 21, the low-side drive circuit 13 outputs a low-side output signal LO to the output terminal LO.

The operation of the semiconductor device having the above structure will now be described by reference to the timing chart of FIG. 6. First, an input logic signal HIN for controlling the high side is inputted to the pulse generation circuit 16 and the overcurrent detection determination circuit 21 and an input logic signal LIN for controlling the low side is inputted to the low-side drive circuit 13. Dead time is set between the input logic signal HIN and the input logic signal LIN so that the high-side power device HQ and the low-side power device LQ will not be in an on state at the same time.

When the input logic signal HIN is inputted, the rising edge trigger circuit 161 of the pulse generation circuit 16 outputs a set signal SET with the rising edge of the input logic signal HIN as a trigger (see SET in FIG. 6 which becomes a high (H) level at the rising edge of HIN). That is to say, when the input logic signal HIN is at a low (L) level, an output of the inverter 1611 of the rising edge trigger circuit 161 illustrated in FIG. 3 is at an H level and the nMOS transistor 1612 of the rising edge trigger circuit 161 is in an on state (pMOS transistor 1613 is in an off state). As a result, electric charges stored in the capacitor 1614 are discharged. Accordingly, an output of the comparator 1615 is at an L level and an output of the inverter 1617 is at an H level. However, because the input logic signal HIN is at the L level, the AND circuit 1618 outputs an L-level set signal SET. When the input logic signal HIN becomes an H level, the AND circuit 1618 which receives the H level from the inverter 1617 outputs an H-level set signal SET. At this time the output of the inverter 1611 becomes an L level and the pMOS transistor 1613 goes into an on state (nMOS transistor 1612 goes into an off state). As a result, the capacitor 1614 is charged. When a charging potential of the capacitor 1614 exceeds the potential of the reference voltage source 1616 after determined time which depends on the capacitance of the capacitor 1614 and the like, the output of the comparator 1615 becomes an H level and the output of the inverter 1617 becomes an L level. As a result, the AND circuit 1618 blocks the H-level input logic signal HIN and outputs the L-level set signal SET. That is to say, the set signal SET is outputted as a pulse signal having a pulse width corresponding to the determined time.

When an H-level set signal SET is outputted, the nMOS transistor HVN1 of the level shift circuit 17 goes into an on state and a potential level at the connection point of the resistor LSR1 and the nMOS transistor HVN1 falls to the level of the ground GND. When the high-side drive circuit 12 detects a fall in the potential level at the connection point of the resistor LSR1 and the nMOS transistor HVN1, a high-side output signal HO goes into a high-potential state with the high-side reference potential VS as reference. As a result, the high-side power device HQ makes a transition to an on state (at this time the low-side power device LQ is in an off state). The high-side reference potential VS rises and a current is supplied to the motor 10. When the high-side reference potential VS rises, an H-level detection signal SENSE is inputted from the high-side potential detection circuit 18 to the high-side potential determination circuit 19 and an output signal MPLS of the comparator 193 becomes an L level. As a result, an output of the inverter 195 makes a transition to an H level. This transition is detected by the rising edge trigger circuit 196 and an event signal EVENT having a pulse width corresponding to determined time is outputted. However, because an output of the inverter 162 illustrated in FIG. 2 is at an L level, the event signal EVENT generated in a period for which the input logic signal HIN is at the H level has no part in control of the high-side power device HQ.

Next, when the input logic signal HIN makes the transition from the H level to an L level, the rising edge trigger circuit 163 of the pulse generation circuit 16 is triggered by the rising edge of an inverted signal of the input logic signal HIN outputted from the inverter 162, and outputs a reset signal RESET. That is to say, the pulse generation circuit 16 generates a reset signal RESET indicated by a dashed line in FIG. 6 with the falling edge of the input logic signal HIN as a trigger.

If external noise enters at timing (time t0) at which the reset signal RESET is outputted, the high-side reference potential VS may fall to the level of the ground GND or below. In this case, the reset signal RESET is not normally transmitted to the high-side drive circuit 12 (reset signal RESET is indicated by the dashed line which indicates that the reset signal RESET is not actually generated). When the high-side reference potential VS falls to the level of the ground GND or below, the output signal MPLS of the comparator 193 of the high-side potential determination circuit 19 once becomes an H level. After that, when the high-side reference potential VS recovers and the detection signal SENSE exceeds a reference voltage REF1 of the reference voltage source 194, the output signal MPLS of the comparator 193 becomes an L level again and the output of the inverter 195 makes a transition to an H level. As a result, an H-level event signal EVENT having a pulse width corresponding to determined time is outputted from the rising edge trigger circuit 196. The input logic signal HIN is at the L level and the output of the inverter 162 is at an H level. Because the H-level event signal EVENT is inputted to the pulse generation circuit 16, an output of the AND circuit 165 becomes an H level and an H-level reset signal RESET is outputted from the OR circuit 164. Accordingly, the high-side output signal HO of the high-side drive circuit 12 makes a transition to an L level at time t2 and the high-side power device HQ is turned off. As a result, the high-side reference potential VS becomes the level of the ground GND and the output signal MPLS of the comparator 193 of the high-side potential determination circuit 19 becomes an H level.

Though the input logic signal HIN makes the transition to the L level, the high-side output signal HO makes the transition to the L level at the time t2 after time t1. A input logic signal LIN may be inputted between the time t1 and time t2, depending on set dead time. FIG. 6 indicates exactly that case. In this case, the high-side power device HQ and the low-side power device LQ are in an on state at the same time and an overcurrent flows.

A current ILQ which is a principal current flowing through the low-side power device LQ is monitored by the overcurrent detection circuit 20. When a current signal IS corresponding to the current ILQ exceeds an overcurrent detection threshold determined by a voltage VIS of the reference voltage source 202, the comparator 201 of the overcurrent detection circuit 20 outputs an H-level overcurrent detection state signal. This signal is held by the RS flip-flop 203 and becomes an overcurrent detection signal OC_OUT. The overcurrent detection signal OC_OUT is transmitted to the overcurrent detection determination circuit 21. The overcurrent detection signal OC_OUT is also inputted to the delay circuit 206. The delay circuit 206 outputs an H-level signal after the elapse of determined delay time. As a result, even if an overcurrent detection state is released (output of the comparator 201 becomes an L level) after the RS flip-flop 203 holds the overcurrent detection state, the RS flip-flop 203 holds the overcurrent detection state until the determined delay time elapses.

The input logic signal HIN inverted by the inverter 211 and the event signal EVENT are inputted to the AND circuit 212 of the overcurrent detection determination circuit 21. After a low-side output signal LO becomes an H level, the input logic signal HIN is at the L level and the event signal EVENT is at the H level. As a result, a signal STOP outputted from the AND circuit 212 is at an H level. Accordingly, an L-level signal obtained by inverting the signal STOP by the inverter 213 is inputted to the AND circuit 214. The overcurrent detection signal OC_OUT is inputted from the overcurrent detection circuit 20 to the AND circuit 214. However, the overcurrent detection signal OC_OUT is blocked by the signal STOP and becomes invalid. Therefore, an overcurrent signal VOC, which is an output of the AND circuit 214, does not become an H level but remains at an L level. When the signal STOP is not outputted (signal STOP is at an L level), the AND circuit 214 makes the overcurrent detection signal OC_OUT inputted from the overcurrent detection circuit 20 pass. As a result, the overcurrent signal VOC becomes an H level and the occurrence of an overcurrent is transmitted to the low-side drive circuit 13.

That is to say, when the input logic signal HIN is at the L level and the event signal EVENT is at the H level, the overcurrent detection signal OC_OUT is made invalid at the same timing as a second reset signal RESET (H-level pulse indicated by a solid line in FIG. 6) for a period for which the signal STOP is at the H level. That is to say, even when the overcurrent detection circuit 20 detects an overcurrent, the overcurrent detection determination circuit 21 makes the overcurrent detection signal OC_OUT invalid and keeps the overcurrent signal VOC at the L level.

As a result, even if the low-side power device LQ is turned on before turning off the high-side power device HQ and an overcurrent occurs, the semiconductor device does not output an operation stop signal or an alarm signal and continues operation as a system.

Second Embodiment

Figure 7:
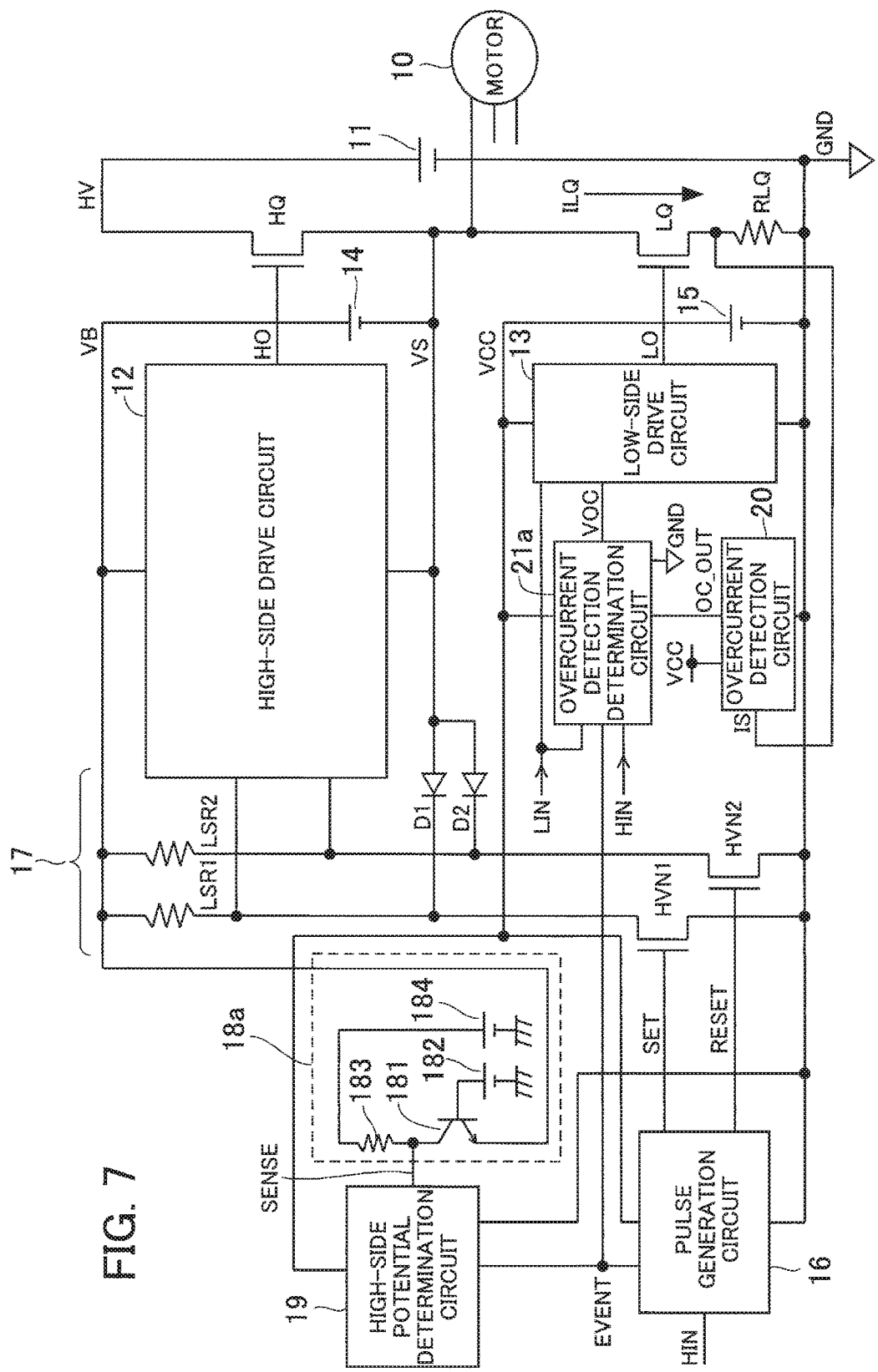
FIG. 7 is a circuit diagram illustrative of a semiconductor device according to a second embodiment.
Figure 8:
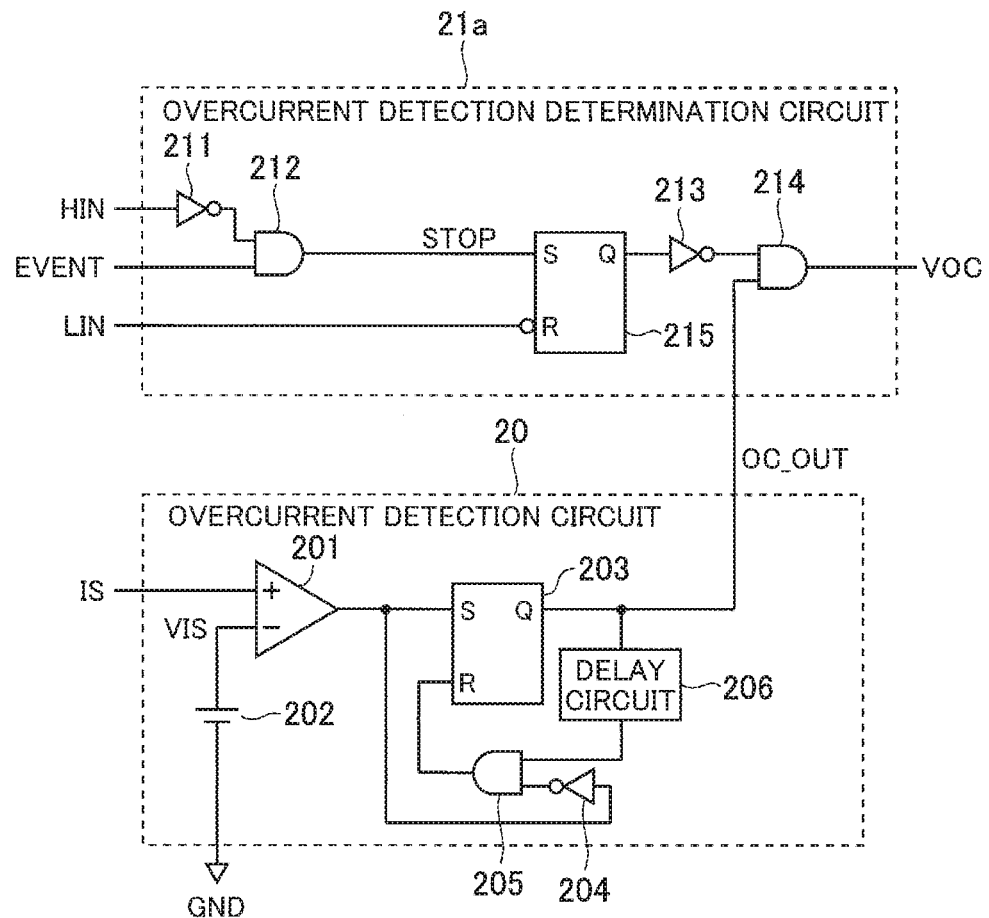
FIG. 8 is a circuit diagram illustrative of examples of an overcurrent detection circuit and an overcurrent detection determination circuit of the semiconductor device according to the second embodiment.

FIG. 7 is a circuit diagram illustrative of a semiconductor device according to a second embodiment. FIG. 8 is a circuit diagram illustrative of examples of an overcurrent detection circuit and an overcurrent detection determination circuit of the semiconductor device according to the second embodiment. Components in FIGS. 7 and 8 which are the same as or equivalent to those illustrated in FIGS. 1 and 5 are marked with the same numerals and detailed descriptions of them will be omitted.

As illustrated in FIG. 7, with a semiconductor device according to a second embodiment the high-side potential detection circuit 18 and the overcurrent detection determination circuit 21 included in the semiconductor device according to the first embodiment are changed to a high-side potential detection circuit 18a and an overcurrent detection determination circuit 21a respectively.

The high-side potential detection circuit 18a detects a high-side power source potential VB as a high-side potential. The high-side power source potential VB is obtained by shifting a high-side reference potential VS by the potential of a high-side power source 14, and changes in the same way as the high-side reference potential VS changes. Therefore, the monitoring of the high-side power source potential VB by the high-side potential detection circuit 18a means monitoring the high-side reference potential VS.

The high-side potential detection circuit 18a includes an npn bipolar transistor 181. An emitter of the bipolar transistor 181 is connected to a line of the high-side power source potential VB. A base of the bipolar transistor 181 is connected to a positive electrode terminal of a voltage source 182. A negative electrode terminal of the voltage source 182 is connected to a ground GND. A collector of the bipolar transistor 181 is connected to one end of a resistor 183. The other end of the resistor 183 is connected to a positive electrode terminal of a voltage source 184. A negative electrode terminal of the voltage source 184 is connected to the ground GND. The collector of the bipolar transistor 181 is an output of the high-side potential detection circuit 18a and outputs a detection signal SENSE. The base-emitter of the bipolar transistor 181 has a reverse breakdown voltage corresponding to a high breakdown voltage of a high-side circuit.

The high-side potential detection circuit 18a has the above structure. When the high-side reference potential VS changes, the high-side power source potential VB changes in the same way as the high-side reference potential VS changes. The bipolar transistor 181 detects the change in the high-side power source potential VB. That is to say, even if the high-side power source potential VB falls most, usually the potential of the high-side power source 14 higher than that of the voltage source 182 is applied to the emitter of the bipolar transistor 181. Therefore, the bipolar transistor 181 is in an off state and a signal at the level of the potential of the voltage source 184 is outputted as a detection signal SENSE.

When the high-side reference potential VS changes and the high-side power source potential VB falls below a potential obtained by subtracting a forward potential of the base-emitter of the bipolar transistor 181 from the potential of the voltage source 182, the bipolar transistor 181 makes a transition to an on state. As a result, the high-side potential detection circuit 18a outputs an L-level detection signal SENSE. When after that the high-side power source potential VB returns to normal, a potential level of the detection signal SENSE becomes the level of the potential of the voltage source 184 again.

The overcurrent detection determination circuit 21a has input terminals for an overcurrent detection signal OC_OUT, an event signal EVENT, and input logic signals HIN and LIN and has an output terminal for an overcurrent signal VOC.

As illustrated in FIG. 8, the overcurrent detection determination circuit 21a differs from the overcurrent detection determination circuit 21 illustrated in FIG. 5 in that it includes an RS flip-flop (first RS flip-flop) 215. That is to say, the RS flip-flop 215 is placed between an AND circuit 212 and an inverter 213. A set input terminal of the RS flip-flop 215 is connected to an output of the AND circuit 212. The input logic signal LIN for controlling a low side is received at a reset input terminal of the RS flip-flop 215.

The overcurrent detection determination circuit 21a holds a signal STOP outputted from the AND circuit 212 by the RS flip-flop 215. While the RS flip-flop 215 holds the signal STOP outputted from the AND circuit 212, the RS flip-flop 215 outputs an H-level signal to the inverter 213. As a result, the inverter 213 outputs an L-level signal to one input of an AND circuit 214. Accordingly, the AND circuit 214 makes the overcurrent detection signal OC_OUT from an overcurrent detection circuit 20 invalid. That is to say, the AND circuit 214 blocks the passage of the overcurrent detection signal OC_OUT and outputs an L-level overcurrent signal VOC to a low-side drive circuit 13.

The RS flip-flop 215 holds the signal STOP until timing at which the input logic signal LIN becomes an L level next. That is to say, when the RS flip-flop 215 is reset by the fall of the input logic signal LIN for controlling the low side, the RS flip-flop 215 outputs an L-level signal to the inverter 213. As a result, the inverter 213 outputs an H-level signal to the one input of the AND circuit 214. Accordingly, the AND circuit 214 makes the overcurrent detection signal OC_OUT from the overcurrent detection circuit 20 valid. That is to say, the AND circuit 214 outputs an H-level overcurrent signal VOC to the low-side drive circuit 13. As a result, when the overcurrent detection circuit 20 detects an overcurrent, the overcurrent detection determination circuit 21a outputs an H-level overcurrent signal VOC. Therefore, the protection function of the low-side drive circuit 13 becomes valid and the low-side drive circuit 13 returns to a state in which the low-side drive circuit 13 can turn off the low-side power device LQ.

The overcurrent detection determination circuit 21a makes overcurrent detection invalid during half of a cycle of the input logic signal LIN for controlling the low side. However, because a high-side power device HQ is reliably turned off by a reset signal RESET generated on the basis of an event signal EVENT, a short-circuit current does not continue flowing through an upper arm or a lower arm.

Furthermore, the overcurrent detection determination circuit 21a is useful especially in a case where delay time of a delay circuit 206 is in some measure long (case where the delay time of the delay circuit 206 is longer than the pulse width of an event signal EVENT, for example) or an application in which external noise is generated again after the end of a signal STOP and in which there may arise a situation where a pulse generation circuit 16 generates a reset signal RESET once again.

If an overcurrent of a low-side power device is detected in the semiconductor device having the above structure when there is a need to reset a high-side power device again, the detection of the overcurrent is made invalid. Therefore, the semiconductor device having the above structure has the advantage of being able to continue operation without undesirably stopping operation or outputting an alarm signal.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:
1. A semiconductor device for driving a power device including a high-side power device and a low-side power device that are connected in series, comprising:
  a high-side drive circuit, configured to drive the high-side power device on the basis of a high-side logic signal, for controlling the high-side power device;
  a high-side potential detection circuit configured to detect a high-side potential to be supplied to the high-side drive circuit;
  a high-side potential determination circuit configured to output an event signal on the basis of a change in the high-side potential detected by the high-side potential detection circuit;
  a low-side drive circuit, configured to drive the low-side power device on the basis of a low-side logic signal, for controlling the low-side power device;
  an overcurrent detection circuit configured to output, to the low-side drive circuit upon detecting an overcurrent by inputting a current signal indicative of a current value of a principal current of the low-side power device, an overcurrent detection signal for turning off the low-side power device; and
  an overcurrent detection determination circuit configured to disable the overcurrent detection signal while both the event signal and the low-side logic signal for turning on the low-side power device are output.
2. The semiconductor device according to claim 1, wherein the overcurrent detection determination circuit includes:
  a first inverter configured to receive the high-side logic signal;

a first AND circuit having one input connected to an output of the first inverter and another input for receiving the event signal;

a second inverter having an input connected to an output of the first AND circuit; and a second AND circuit having one input connected to an output of the second inverter, another input for receiving the overcurrent detection signal from the overcurrent detection circuit, and an output connected to the low-side drive circuit.

3. The semiconductor device according to claim 2, wherein the overcurrent detection determination circuit further includes a first RS flip-flop between the first AND circuit and the second inverter, the RS flip-flop having a set input terminal connected to the output of the first AND circuit, a reset input terminal connected so as to receive an inversion of the low-side logic signal, and an output connected to the input of the second inverter.

4. The semiconductor device according to claim 2, wherein the overcurrent detection circuit includes:

a comparator configured to compare the current signal with an overcurrent detection threshold;

a second RS flip-flop configured to
hold an overcurrent detection state signal, and
output the overcurrent detection signal, the comparator outputting the overcurrent detection state signal at the time of the current signal exceeding the overcurrent detection threshold;

a delay circuit configured to delay the overcurrent detection signal for a determined time;

a third inverter having an input connected to an output of the comparator; and a third AND circuit having one input connected to an output of the delay circuit, another input connected to an output of the third inverter, and an output connected to a reset input terminal of the second RS flip-flop.

5. The semiconductor device according to claim 1, wherein the high-side potential detection circuit detects one of a high-side reference potential and a high-side power supply potential as the high-side potential.

6. The semiconductor device according to claim 1, wherein the high-side potential determination circuit includes a rising edge trigger circuit configured to output an output signal as the event signal upon detecting the high-side potential rising.

* * * * *